US006730454B2

(12) United States Patent
Pfeiffer et al.

(10) Patent No.: US 6,730,454 B2
(45) Date of Patent: May 4, 2004

(54) ANTIREFLECTIVE SIO-CONTAINING COMPOSITIONS FOR HARDMASK LAYER

(75) Inventors: Dirk Pfeiffer, Dobbs Ferry, NY (US); Marie Angelopoulos, Cortlandt Manor, NY (US); Katherina Babich, Chappaqua, NY (US); Phillip Brock, Sunnyvale, CA (US); Wu-Song Huang, Poughkeepsie, NY (US); Arpan P. Mahorowala, Bronxville, NY (US); David R. Medeiros, Ossining, NY (US); Ratnam Sooriyakumaran, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 10/124,087

(22) Filed: Apr. 16, 2002

(65) Prior Publication Data

US 2003/0198877 A1 Oct. 23, 2003

(51) Int. Cl.$^7$ .................................................. G03F 7/00
(52) U.S. Cl. .............................. 430/270.1; 430/271.1; 430/272.2; 430/311; 430/313; 430/510; 430/512; 430/950
(58) Field of Search ................................ 430/311, 313, 430/322, 270.1, 271.1, 272.2, 510, 512, 950

(56) References Cited

U.S. PATENT DOCUMENTS

| 6,268,457 | B1 | | 7/2001 | Kennedy et al. ............... 528/39 |
| 6,410,209 | B1 | * | 6/2002 | Adams et al. ............... 430/311 |
| 6,420,088 | B1 | * | 7/2002 | Angelopoulos et al. .. 430/272.1 |
| 6,503,689 | B2 | * | 1/2003 | Zampini et al. ......... 430/270.1 |
| 6,503,692 | B2 | * | 1/2003 | Angelopoulos et al. ..... 430/310 |
| 2002/0195419 | A1 | * | 12/2002 | Pavelchek .................... 216/16 |

FOREIGN PATENT DOCUMENTS

| EP | 1 061 560 A2 | 12/2000 |
| WO | WO 00/77575 A1 | 12/2000 |

* cited by examiner

Primary Examiner—Mark F. Huff
Assistant Examiner—Nicole Barreca
(74) Attorney, Agent, or Firm—Steven Capella

(57) ABSTRACT

Antireflective compositions characterized by the presence of an SiO-containing polymer having chromophore moieties and transparent moieties are useful antireflective hardmask compositions in lithographic processes. These compositions provide outstanding optical, mechanical and etch selectivity properties while being applicable using spin-on application techniques. The compositions of the invention are advantageously useful with shorter wavelength lithographic processes and/or have minimal residual acid content.

11 Claims, No Drawings ature of the invention

ANTIREFLECTIVE SIO-CONTAINING COMPOSITIONS FOR HARDMASK LAYER

BACKGROUND OF THE INVENTION

In the microelectronics industry as well as in other industries involving construction of microscopic structures (e.g. micromachines, magnetoresistive heads, etc.), there is a continued desire to reduce the size of structural features. In the microelectronics industry, the desire is to reduce the size of microelectronic devices and/or to provide greater amount of circuitry for a given chip size.

Effective lithographic techniques are essential to achieving reduction of feature sizes. Lithography impacts the manufacture of microscopic structures not only in terms of directly imaging patterns on the desired substrate, but also in terms of making masks typically used in such imaging. Typical lithographic processes involve formation of a patterned resist layer by patternwise exposing the radiation-sensitive resist to an imaging radiation. The image is subsequently developed by contacting the exposed resist layer with a material (typically an aqueous alkaline developer) to selectively remove portions of the resist layer to reveal the desired pattern. The pattern is subsequently transferred to an underlying material by etching the material in openings of the patterned resist layer. After the transfer is complete, the remaining resist layer is then removed.

For some lithographic imaging processes, the resist used does not provide sufficient resistance to subsequent etching steps to enable effective transfer of the desired pattern to a layer underlying the resist. In many instances (e.g., where an ultrathin resist layer is desired, where the underlying material to be etched is thick, where a substantial etching depth is required, and/or where it is desired to use certain etchants for a given underlying material), a so-called hardmask layer is used intermediate between the resist layer and the underlying material to be patterned by transfer from the patterned resist. The hardmask layer receives the pattern from the patterned resist layer and should be able withstand the etching processes needed to transfer the pattern to the underlying material.

While many hardmask materials exist in the prior art, there is a continued desire for improved hardmask compositions. Many of the prior art materials are difficult to apply to the substrate, e.g., they may require use of chemical or physical vapor deposition, special solvents, and/or high temperature baking. It would be desirable to have hardmask compositions which could be applied by spin-coating techniques without need for a high temperature bake. Additionally, it is desirable to have hardmask compositions which can be easily etched selective to the overlying photoresist while being resistant to the etch process needed to pattern the underlying layer, especially where the underlying layer is a metal layer. It is also desired to provide adequate shelf-life and to avoid adverse interaction with the imaging resist layer (e.g., by acid contamination from the hardmask). Additionally, it is desired to have hardmask compositions which possess the desired optical characteristics relative to shorter wavelength (e.g., <200 nm) imaging radiation.

SUMMARY OF THE INVENTION

The invention encompasses novel antireflective hardmask compositions which are useful in lithographic processes. These compositions provide outstanding optical, mechanical and etch selectivity properties while being applicable using spin-on application techniques. The compositions also have good shelf-life and minimal or no acid contaminant content. The antireflective hardmask compositions are characterized by the presence of an SiO-containing polymer having chromophore moieties and transparent moieties. The invention also encompasses methods of using the hardmask compositions of the invention to pattern underlying material layers on a substrate. The invention also encompasses lithographic structures such as a patterned combination of resist layer and hardmask layer.

In one aspect, the invention encompasses a composition suitable for formation of a spin-on antireflective hardmask layer, the composition comprising:

(a) an SiO-containing polymer having chromophore moieties and transparent moieties, (b) a crosslinking component, and (c) an acid generator.

The SiO moieties are preferably selected from the group consisting of siloxane moieties and silsesquioxane moieties. The SiO moieties are preferably in a backbone portion of the polymer. The SiO-containing polymer also preferably contains a plurality of reactive sites distributed along the polymer for reaction with the crosslinking component. The acid generator is preferably a thermally activated acid generator. The transparent moieties are preferably bulky ($C_2$ or higher) or fluorine-containing moieties which are substantially transparent to the desired imaging radiation.

In another aspect, the invention encompasses method of forming a patterned material feature on a substrate, the method comprising:

(a) providing a material layer on a substrate, (b) forming an antireflective hardmask layer of the invention over the material layer, (c) forming a radiation-sensitive imaging layer over the antireflective layer, (d) patternwise exposing the imaging layer to radiation thereby creating a pattern of radiation-exposed regions in the imaging layer, (e) selectively removing portions of the imaging layer and the antireflective layer to expose portions of the material layer, and (f) etching the exposed portions of the material layer, thereby forming the patterned material feature.

The material to be patterned is preferably a conductive, semiconductive, magnetic or insulative material, more preferably a metal. The SiO moieties are preferably in a backbone portion of the polymer. The SiO-containing polymer also preferably contains a plurality of reactive sites distributed along the polymer for reaction with the crosslinking component.

These and other aspects of the invention are discussed in further detail below.

DETAILED DESCRIPTION OF THE INVENTION

The invention encompasses novel antireflective hardmask compositions which are useful in lithographic processes. These antireflective hardmask compositions are characterized by the presence of an SiO-containing polymer having chromophore moieties and transparent moieties. The invention also encompasses methods of using the antireflective hardmask compositions of the invention to pattern underlying material layers on a substrate. The invention also encompasses lithographic structures such as a patterned combination of resist layer and hardmask layer.

The antireflective hardmask compositions of the invention generally comprise:

(a) an SiO-containing polymer having chromophore moieties and transparent moieties,
(b) a crosslinking component, and
(c) an acid generator.

The SiO-containing polymer preferably contains SiO moieties in its backbone. The polymer is preferably an organosiloxane, more preferably organosilsesquioxane. The polymer should have solution and film-forming characteristics conducive to forming a layer by conventional spin-coating.

In general, the polymer preferably contains one or more monomers having structures selected from (I)–(III) below:

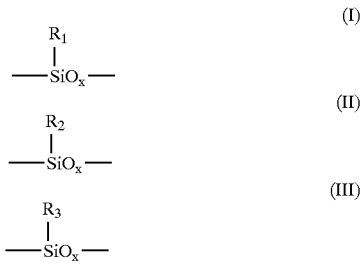

where x is from about 1 to about 1.5. $R_1$ comprises a chromophore moiety; $R_2$ comprises a transparent moiety; $R_3$ comprises a reactive site for reaction with the crosslinking component. For linear organosiloxane polymers, x would equal about 1. For silsesquioxane polymers, x would equal about 1.5. In some instances, multiple functional moieties may be present on the same monomer (e.g., a reactive group and a chromophore). Generally, silsesquioxane polymers are preferred on the basis of superior etch resistance. If the ordinary organosiloxane polymers are used, then preferably, the degree of crosslinking is increased compared to formulations based on silsesquioxanes.

The chromophore-containing groups $R_1$ may contain any suitable chromophore which (i) can be grafted onto the SiO-containing polymer (ii) has suitable radiation absorption characteristics, and (iii) does not adversely affect the performance of the layer or any overlying photoresist layers. Preferred chromophore moieties include phenyl, chrysenes, pyrenes, fluoranthrenes, anthrones, benzophenones, thioxanthones, and anthracenes. Anthracene derivatives, such as those described in U.S. Pat. No. 4,371,605 may also be used; the disclosure of this patent is incorporated herein by reference. 9-anthracene methanol is a preferred chromophore. The chromophore moiety preferably does not contain nitrogen, except for possibly deactivated amino nitrogen such as in phenol thiazine. For 193 nm radiation, non-aromatic compounds containing unsaturated carbon bonds (e.g., carbon—carbon double bonds) are also suitable chromophores. For 157 nm radiation, compounds containing saturated carbon—carbon bonds can act as chromophores.

The chromophore moieties may be chemically attached to the SiO containing polymer by acid-catalyzed O-alkylation or C-alkylation such as by Friedel-Crafts alkylation. Alternatively, the chromophore moiety may be attached by an esterification mechanism. A preferred acid for Friedel-Crafts catalysis is HCl. Preferably, about 15 to 40% of the monomers contain chromophore moieties. In some instances, it may be possible to bond the chromophore to the monomer before formation of the SiO-containing polymer, however this is generally not preferred. The site for attachment of the chromophore is preferably an aromatic group such as a hydroxybenzyl or hydroxymethylbenzyl group. Alternatively, the chromophore may be attached by reaction with other moieties such as cyclohexanol or other alcohols. The reaction to attach the chromophore is preferably an esterification of the alcoholic OH group.

$R_2$ transparent moieties may vary depending on the wavelength or character of the imaging radiation. In the case of 193 nm imaging radiation, the transparent moieties are preferably a bulky ($C_2$ or higher) organic moieties substantially free of unsaturated carbon—carbon bonds. A preferred transparent moiety for 193 nm applications in an alcohol derived from an epoxy-functionalized silsesquioxane monomer. In the case of 157 nm imaging radiation, the transparent moieties are preferably fluorine-containing moieties such as a trifluoromethyl group or perfluoroalkyl. The amount of transparent moieties is preferably balanced with the amount of chromophore to provide a desired combination of energy absorption and antireflection.

$R_3$ comprises a reactive site for reaction with the crosslinking component. Preferred reactive moieties contained in $R_2$ are alcohols, more preferably aromatic alcohols (e.g., hydroxybenzyl, phenol, hydroxymethylbenzyl, etc.) or cycloaliphatic alcohols (e.g., cyclohexanoyl). Alternatively, non-cyclic alcohols such as fluorocarbon alcohols, aliphatic alcohols, amino groups, vinyl ethers, and epoxides may be used.

Examples of SiO containing polymers include:
poly(3-propanoloxypropyl)silsesquioxane, copolymer of 3-propanoloxypropylsilsesquioxane and phenylsilsesquioxane, blend of poly(hydroxybenzyl) silsesquioxane and poly(1-hydroxy-1-trifluoromethylethyl) silsesquioxane, copolymer of 1-hydroxy-1-trifluoromethylethylsilsesquioxane and p-Hydroxymethylbenzylsilsesquioxane.

The SiO-containing polymers of the invention preferably have a weight average molecular weight, before reaction with the crosslinking component, of at least about 1000, more preferably a weight average molecular weight of about 1000–10000.

The crosslinking component is preferably a crosslinker that can be reacted with the SiO-containing polymer in a manner which is catalyzed by generated acid and/or by heating. Generally, the crosslinking component used in the antireflective hardmask compositions of the invention may be any suitable crosslinking agent known in the negative photoresist art which is otherwise compatible with the other selected components of the composition. The crosslinking agents preferably act to crosslink the polymer component in the presence of a generated acid. Preferred crosslinking agents are glycoluril compounds such as tetramethoxymethyl glycoluril, methylpropyltetramethoxymethyl glycoluril, and methylphenyltetramethoxymethyl glycoluril, available under the POWDERLINK trademark from Cytec Industries. Other possible crosslinking agents include: 2,6-bis(hydroxymethyl)-p-cresol compounds such as those found in Japanese Laid-Open Patent Application (Kokai) No. 1-293339, etherified amino resins, for example methylated or butylated melamine resins (N-methoxymethyl- or N-butoxymethyl-melamine respectively), and methylated/butylated glycolurils, for example as can be found in Canadian Patent No. 1 204 547. Other crosslinking agents such as bis-epoxies or bis-phenols (e.g., bisphenol-A) may also be used. Combinations of crosslinking agents may be used.

The acid generator is preferably an acid generator compound is employed that liberates acid upon thermal treatment. A variety of known thermal acid generators are suitably employed such as e.g. 2,4,4,6-tetrabromocyclohexadienone, benzoin tosylate, 2-nitrobenzyl tosylate and other alkyl esters of organic sulfonic acids. Compounds that generate a sulfonic acid upon activation are generally suitable. Other suitable thermally activated acid generators are described in U.S. Pat. Nos. 5,886,102 and 5,939,236; the disclosures of these two patents are incorporated herein by reference. If desired, a radiation-sensitive acid generator may be employed as an alternative to a thermally activated acid generator or in combination with a thermally activated acid generator. Examples of suitable radiation-sensitive acid generators are described in U.S. Pat. Nos. 5,886,102 and 5,939,236. Other radiation-sensitive acid generators known in the resist art may also be used as long as they are compatible with the other components of the antireflective composition. Where a radiation-sensitive acid generator is used, the cure (crosslinking) temperature of the composition may be reduced by application of appropriate radiation to induce acid generation which in turn catalyzes the crosslinking reaction. Even if a radiation-sensitive acid generator is used, it is preferred to thermally treat the composition to accelerate the crosslinking process (e.g., for wafers in a production line).

The antireflective hardmask compositions of the invention preferably contain (on a solids basis) (i) about 50–98 wt. % of the SiO-containing polymer, more preferably about 70–80 wt. %, (ii) about 1–50 wt. % of crosslinking component, more preferably about 3–25%, and (iii) about 1–20 wt. % acid generator, more preferably about 1–15 wt. %.

The antireflective hardmask compositions of the invention may be used in combination with any desired resist material in the forming of a lithographic structure. Preferably, the resist is imageable with shorter wavelength ultraviolet radiation (e.g. <200 nm wavelength) or with electron beam radiation. Examples of suitable resist materials are described in U.S. Pat. No. 6,037,097, the disclosure of which is incorporated herein by reference.

The antireflective hardmask compositions of the invention will typically contain a solvent prior to their application to the desired substrate. The solvent may be any solvent conventionally used with resists which otherwise does not have any excessively adverse impact on the performance of the antireflective composition. Preferred solvents are propylene glycol monomethyl ether acetate, cyclohexanone, and ethyl lactate. The amount of solvent in the composition for application to a substrate is preferably sufficient to achieve a solids content of about 8–20 wt. %. Higher solids content formulations will generally yield thicker coating layers. The compositions of the invention may further contain minor amounts of auxiliary components (e.g., base additives, etc.) as may be known in the art.

The antireflective hardmask compositions of the invention can be prepared by combining the polymer, crosslinking component and acid generator, and any other desired ingredients using conventional methods. The compositions of the invention advantageously may be formed into antireflective hardmask layers on a substrate by spin-coating followed by baking to achieve crosslinking and solvent removal. The baking is preferably conducted at about 250° C. or less, more preferably about 150°–220° C. The baking time may be varied depending on the layer thickness and bake temperature.

The thickness of the antireflective hardmask composition of the invention may be varied depending on the desired function. For typical applications, the thickness of the composition is preferably about 0.02–5.0 µm, more preferably about 0.1–5.0 µm. If desired, the compositions of the invention may also be used as dielectric materials in a similar manner to conventional spin-on glass materials. The compositions of the invention advantageously resist lateral etch such that they may act as hard masks even at thin film thickness traditionally associated with organic antireflective layers.

The hardmask compositions of the invention are especially useful for lithographic processes used in the manufacture of integrated circuits on semiconductor substrates. The compositions are especially useful for lithographic processes using 193 nm, 157 nm, EUV, x-ray, e-beam or other imaging radiation.

Semiconductor lithographic applications generally involve transfer of a pattern to a layer of material on the semiconductor substrate. The material layer of the semiconductor substrate may be a metal conductor layer, a ceramic insulator layer, a semiconductor layer or other material depending on the stage of the manufacture process and the desired material set for the end product. The composition of the invention is preferably applied directly over the material layer to be patterned, preferably by spin-coating. The composition is then baked to remove solvent and cure (crosslink) the composition. A radiation-sensitive resist layer can then be applied (directly or indirectly) over the cured antireflective composition of the invention.

Typically, the solvent-containing resist composition is applied using spin coating or other technique. The substrate with the resist coating is then preferably heated (pre-exposure baked) to remove the solvent and improve the coherence of the resist layer. The thickness of the applied layer is preferably as thin as possible with the provisos that the thickness is preferably substantially uniform and that the resist layer be sufficient to withstand subsequent processing (typically reactive ion etching) to transfer the lithographic pattern to the underlying substrate material layer. The pre-exposure bake step is preferably conducted for about 10 seconds to 15 minutes, more preferably about 15 seconds to one minute. The pre-exposure bake temperature may vary depending on the glass transition temperature of the photoresist.

After solvent removal, the resist layer is then patternwise-exposed to the desired radiation (e.g. 193 nm ultraviolet radiation). Where scanning particle beams such as electron beam are used, patternwise exposure may be achieved by scanning the beam across the substrate and selectively applying the beam in the desired pattern. More typically, where wavelike radiation forms such as 193 nm ultraviolet radiation, the patternwise exposure is conducted through a mask which is placed over the resist layer. For 193 nm UV radiation, the total exposure energy is preferably about 100 millijoules/cm$^2$ or less, more preferably about 50 millijoules/cm$^2$ or less (e.g. 15–30 millijoules/cm$^2$).

After the desired patternwise exposure, the resist layer is typically baked to further complete the acid-catalyzed reaction and to enhance the contrast of the exposed pattern. The post-exposure bake is preferably conducted at about 60–175° C., more preferably about 90–160° C. The post-exposure bake is preferably conducted for about 30 seconds to 5 minutes.

After post-exposure bake, the resist structure with the desired pattern is obtained (developed) by contacting the resist layer with an alkaline solution which selectively dissolves the areas of the resist which were exposed to radiation. Preferred alkaline solutions (developers) are aqueous solutions of tetramethyl ammonium hydroxide. The resulting lithographic structure on the substrate is then typically dried to remove any remaining developer solvent.

The pattern from the resist structure may then be transferred to the exposed portions of the layer of antireflective material of the invention by etching with $CF_4$ or other suitable etchant using techniques known in the art.

After the opening of the layer of antireflective hardmask of the invention, the underlying material layer to be patterned may then be etched using an etchant appropriate to the material layer composition. Where the material layer is a metal (e.g., Cr) a combination of $Cl_2/O_2$ may be used as a dry etchant.

Once the desired pattern transfer has taken place, any remaining resist may be removed using conventional stripping techniques. If the composition of the invention is being used strictly as a hardmask, the composition of the invention may be removed by contacting with a $CF_4/O_2$ plasma.

Thus, the compositions of the invention and resulting lithographic structures can be used to create patterned material layer structures such as metal wiring lines, holes for contacts or vias, insulation sections (e.g., damascene trenches or shallow trench isolation), trenches for capacitor structures, etc. as might be used in the design of integrated circuit devices. The compositions are especially useful in the context of creating patterned layers of oxides, nitrides or polysilicon.

Examples of general lithographic processes where the composition of the invention may be useful are disclosed in U.S. Pat. Nos. 4,855,017; 5,362,663; 5,429,710; 5,562,801; 5,618,751; 5,744,376; 5,801,094; 5,821,469 and 5,948,570, the disclosures of which patents are incorporated herein by reference. Other examples of pattern transfer processes are described in Chapters 12 and 13 of "Semiconductor Lithography, Principles, Practices, and Materials" by Wayne Moreau, Plenum Press, (1988), the disclosure of which is incorporated herein by reference. It should be understood that the invention is not limited to any specific lithographic technique or device structure.

EXAMPLE 1

(Polymer A)

The silicone precursor 3-glycidoxypropyltrimethoxysilane (47.26 g, 200 mmol) (available from Aldrich) was dissolved in 100 ml of tetrahydrofuran (THF) and then hydrolyzed by a mixture of THF and 1 N HCl at room temperature. The reaction mixture was then refluxed for 18 hours to complete the hydrolysis. After cooling down to room temperature, 150 ml of diethylether were added and the aqueous phase was separated from the organic phase and discarded. The organic phase was washed with brine (50 ml) twice and dried over magnesium sulfate, followed by removal of the solvent in vacuum, leaving the polymer as a clear viscous oil behind. The polymer was dried in vacuum and the final yield was ca. 27 g. The material was characterized by NMR and IR, showing that the epoxy functional group was converted to an alcohol functional group.

(Polymer B)

The silicone precursors phenyltrimethoxysilane (7.92 g, 40 mmol) and 3-glycidoxypropyltrimethoxysilane (37.82 g, 160 mmol) (both available from Aldrich) were reacted in the same manner described in for Polymer A to give the polymer in a final yield of ca. 25 g.

(Polymer C)

Poly(hydroxybenzyl)silsesquioxane (PHBSQ —obtained from DayChem Laboratories in Vandalia, Ohio)

(Polymer D)

Poly(1-Hydroxy-1-Trifluoromethylethyl) silsesquioxane (TFASSQ) was synthesized according to the procedure of U.S. patent application Ser. No. 09/748071 ("Substantially Transparent Aqueous Base Soluble Polymer System For Use In 157 nm Resist Applications") filed Dec. 21, 2000, published as U.S. 2002/0081520.

EXAMPLE 2

Formulation

The desired SiO-containing polymer component was dissolved in propylene glycol monomethyl ether acetate (PGMEA) in concentrations of 100 parts by weight. A crosslinking agent tetramethoxymethyl glycoluril, available from DayChem, in a concentration of 8 parts by weight and di(t-butylphenyl)iodoniumperfluorobutylsulfonate (DtBPI-PFBuS) in a concentration of 4 parts by weight were added to the solution, achieving 14 wt. % of total solids.

EXAMPLE 3

Film Formation and Optical Properties

Formulations, prepared as described in Example 2, were spin coated onto a 300 mm silicon wafer at 3000 rpm for 60 sec. The film thickness was about 2500 Å. The spin cast film was cured at 200° C. for 60 sec. The optical constants (the index of refraction n and the extinction coefficient k at 193 nm) are measured using an n&k Analyzer manufactured by n&k Technology, Inc.

The optical properties of the films for 193 nm radiation were as follows:

| Film Polymer | n | K |
|---|---|---|
| Polymer A | 1.656 | 0.006 |
| Polymer B | 1.726 | 0.390 |
| Polymer C | 1.556 | 0.000 |
| Polymers C & D (1:1 wt/wt) | 1.689 | 0.205 |

EXAMPLE 4

Shelf Life Study

A formulation described in Example 2 using Polymer B was divided into two batches. One batch was stored at −20° C. over period of one month and the other batch was stored at 40° C. over period of one month. The reflectance spectra of two films from each batch formed by the method described in Example 3 are identical demonstrating the formulation has not aged.

EXAMPLE 5

193 nm Lithography and Etching the Hardmask/antireflective Layer

The hardmask layer was formed as described in Example 3 using the Polymer B. A layer of PAR 715 acrylic-based photoresist (sold by Sumitomo) was spin-coated over the cured hardmask layer to a thickness of about 250 nm. The photoresist was baked at 130° C. for 60 seconds. The resist layer was then imaged using a 0.6 NA 193 nm Nikon Stepper with conventional and annular illumination using APSM reticle. After patternwise exposure, the resist was baked at 130° C. for 60 seconds. The image was then developed using commercial developer (0.26M TMAH). The resulting pattern showed 113.75 and 122.5 nm equal lines and space patterns.

The pattern was then transferred into the hard mask layer by a 20 second fluorocarbon based etch using a TEL DRM tool. The etch selectivity between the photoresist and the hardmask exceeded 10:1, demonstrating that virtually no resist is lost during the hardmask open etch.

The etch selectivity of the oxide to hardmask (Polymer B) was determined on blanket films to be 2.5:1 and 3.3:1 for the resist (PAR 715) to oxide, respectively, using a fluorocarbon based etch performed on a TEL DRM tool. The combined etch selectivities will give an overall etch selectivity of the pattern transfer from oxide to organic resist >20:1 which is superior to any known organic hardmasks.

What is claimed is:

1. A composition suitable for formation of a spin-on antireflective hardmask layer, said composition comprising:
   (a) an SiO-containing polymer (i) having a backbone containing SiO moieties, (ii) having chromophore moieties, and (iii) having transparent moieties,
   (b) a separate crosslinking component, and
   (c) an acid generator.

2. The composition of claim 1 wherein said transparent moieties are substantially free of unsaturated carbon—carbon bonds.

3. The composition of claim 1 wherein said chromophore moieties contain unsaturated carbon—carbon bonds.

4. The composition of claim 1 wherein said composition transparent moieties are substantially transparent to 157 nm radiation.

5. The composition of claim 4 wherein said transparent moieties are selected from the group consisting of perfluoroalkyl and trifluoromethyl.

6. The composition of claim 1 wherein said acid generator is a thermally activated acid generator.

7. The composition of claim 1 wherein said SiO-containing polymer further comprises a plurality of reactive sites distributed along the polymer for reaction with the crosslinking components.

8. The composition of claim 1 wherein said chromophore moieties are selected from the group consisting of phenyl, chrysenes, pyrenes, fluoranthrenes anthrones, benzophenones, thioxanthones, anthracenes, and compounds containing carbon—carbon double bonds.

9. The composition of claim 1 wherein said crosslinking component comprises a glycoluril compound.

10. The composition of claim 1 wherein said composition consists essentially of components (a), (b), and (c).

11. The composition of claim 1 wherein polymer comprises one or more monomers selected from the group consisting of

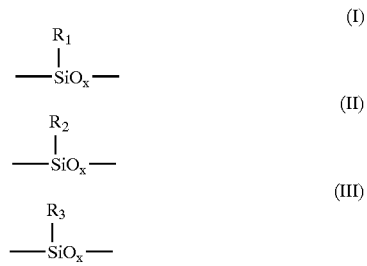

wherein x is from about 1 to about 1.5, $R_1$ is a chromophore moiety, $R_2$ is a transparent moiety, and $R_3$ is a reactive site for reaction with said crosslinking component.

* * * * *